(12) United States Patent
Szczepanik et al.

(10) Patent No.: US 11,122,123 B1
(45) Date of Patent: Sep. 14, 2021

(54) METHOD FOR A NETWORK OF STORAGE DEVICES

(71) Applicant: International Business Machines Corporation, Armonk, NY (US)

(72) Inventors: Grzegorz Piotr Szczepanik, Cracow (PL); Kushal Patel, Pune (IN); Lukasz Jakub Palus, Cracow (PL); Sarvesh S. Patel, Pune (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/812,512

(22) Filed: Mar. 9, 2020

(51) Int. Cl.
| | | |
|---|---|---|
| H04L 29/08 | (2006.01) | |
| H04L 12/801 | (2013.01) | |
| G06F 9/54 | (2006.01) | |
| H03M 7/30 | (2006.01) | |

(52) U.S. Cl.
CPC .......... *H04L 67/1097* (2013.01); *G06F 9/547* (2013.01); *H03M 7/30* (2013.01); *H04L 47/127* (2013.01); *H04L 69/324* (2013.01)

(58) Field of Classification Search
None
See application file for complete search history.

(56) References Cited

U.S. PATENT DOCUMENTS

| | | |
|---|---|---|
| 7,171,484 B1 | 1/2007 | Krause |
| 7,380,019 B2 | 5/2008 | Shiga |
| 7,643,505 B1 * | 1/2010 | Colloff ............... H03M 7/3084 370/422 |
| 7,721,022 B2 | 5/2010 | Brewer |
| 8,391,148 B1 * | 3/2013 | Wang .................. H04L 41/0803 370/235 |
| 2004/0017816 A1 * | 1/2004 | Ishwar .................... H04L 45/50 370/395.53 |
| 2005/0223089 A1 * | 10/2005 | Rhodes ............... H04L 43/0876 709/223 |
| 2006/0095686 A1 | 5/2006 | Miller |
| 2008/0294996 A1 | 11/2008 | Hunt |
| 2010/0082855 A1 | 4/2010 | Accapadi |
| 2011/0013644 A1 * | 1/2011 | Das ....................... H04L 47/724 370/458 |
| 2013/0073783 A1 | 3/2013 | Cao |
| 2013/0283094 A1 * | 10/2013 | Baptist .................. H04L 63/08 714/6.2 |
| 2014/0195699 A1 | 7/2014 | Sokol, Jr. |

(Continued)

*Primary Examiner* — Jeffrey R Swearingen
(74) *Attorney, Agent, or Firm* — Stephanie L. Carusillo

(57) ABSTRACT

The present disclosure relates to a method for data communication between nodes and storage devices via a networking device of a network, wherein data access to a storage device of the network by a node is performed in accordance with a data access mode being a normal data access mode. The networking device is configured to share available resources of the networking device between the data links. The method comprises: determining that a network congestion may occur in the network. At least one data link defined by a node and a storage device may be identified. The data access mode may be switched for the identified data link from the normal data access mode to a compressed data access mode. The compressed data access mode enables exchange of compressed data via the identified data link, thereby increasing available resources of the networking device.

18 Claims, 4 Drawing Sheets

(56) References Cited

U.S. PATENT DOCUMENTS

| | | | |
|---|---|---|---|
| 2015/0254088 A1* | 9/2015 | Chou | G06F 3/067 709/212 |
| 2016/0135077 A1* | 5/2016 | Streijl | H04L 47/127 370/230 |
| 2016/0173383 A1* | 6/2016 | Liu | H04L 47/26 370/235 |
| 2019/0068521 A1 | 2/2019 | Kumar | |

* cited by examiner

METHOD FOR A NETWORK OF STORAGE DEVICES

BACKGROUND

The present invention relates to the field of digital computer systems, and more specifically, to a network of storage devices.

Faced with explosive data growth, data centers need more input/output (I/O) capacity to accommodate massive amounts of data, applications, and workloads. In addition to this surge in data, collective expectations for availability continue to rise. Users expect applications to be available and accessible from anywhere, at any time, on any device.

SUMMARY

Various embodiments provide a method, computer system, and computer program product for a network of storage devices. In one aspect of the method, data communication between nodes and storage devices via a networking device of a network, wherein data access to a storage device of the network by a node is performed in accordance with a data access mode being a normal data access mode, the node and the storage device defining a data link passing through the networking device, and the networking device being configured to share available resources of the networking device between the data links. In this embodiment, a processor determines that a network congestion may occur in the network, the network congestion involving the networking device. In this embodiment, a processor identifies at least one data link defined by a node and a storage device each of which having a defined amount of available processing resources. In this embodiment, a processor switches the data access mode for the identified data link from the normal data access mode to a compressed data access mode, the compressed data access mode enabling exchange of compressed data via the identified data link, thereby increasing available resources of the networking device.

In another aspect, a computer program product comprises a computer-readable storage medium having computer-readable program code embodied therewith, in which the computer-readable program code is configured to implement the method according to preceding embodiments.

In another aspect, a computer system comprises one or more processors and one or more computer-readable storage mediums having computer-readable program code embodied therewith, in which the computer-readable program code is configured to implement the method according to preceding embodiments.

Embodiments of the present invention provide a mechanism for congestion removal without affecting application data transmission. In particular, the application data may not be stopped to solve the network congestion. This may enable high endurance of the storage system and robustness in overall appliance architectures. This may also increase the availability of storage networks. For example, embodiments of the present invention may use its own available CPU computing capability to reduce the network congestion.

The network of storage devices, the networking device(s) and the nodes may be comprised in a storage system. The storage system may enable a storage appliance. Embodiments of the present invention may not require an additional space and can be implemented easily using the existing space already available in the storage system. Embodiments of the present invention may be transparent to the user in that the user may not realize the switching between the modes of operations.

Embodiments of the present invention may dynamically adjust the operations at various levels of a network of storage devices, which optimizes system performance. Embodiments of the present invention may enable a selective compression across software defined networks in the cloud that may result in less cost for data transmission instead of high cost dynamic provisioning of network capabilities.

By compressing data in the identified links, the available resources used by the networking device may be increased and may thus enable the congested links to get more resources in order to be processed.

DETAILED DESCRIPTION

Figure 1:
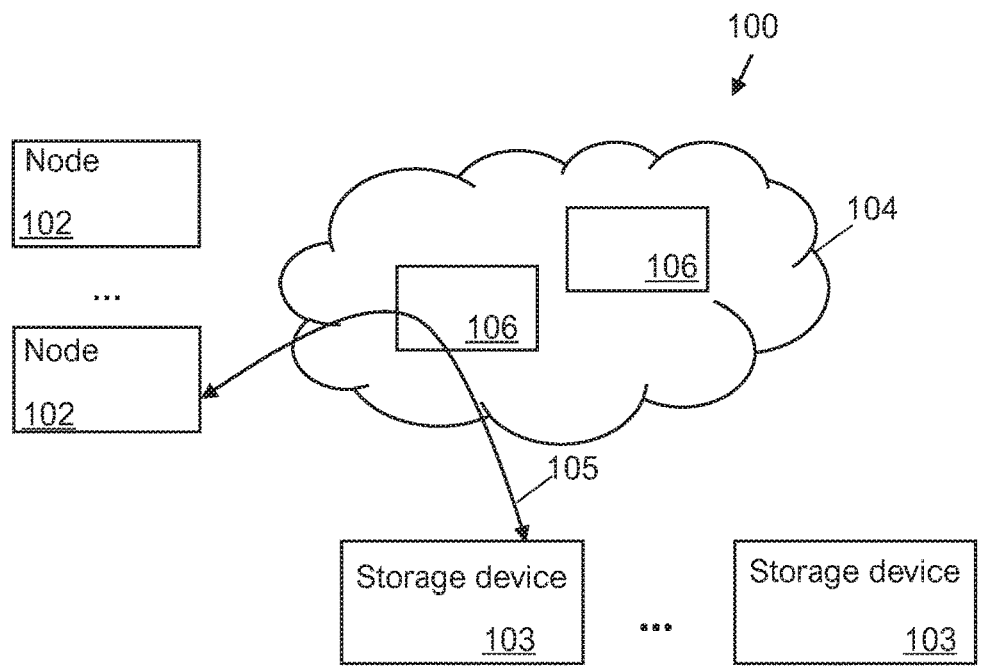
FIG. 1 is a block diagram of a storage system in accordance with an embodiment of the present invention.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Data transmission in a network of storage devices may internally be amplified and data may travel multiple times across the same switch. This may result in a network congestion. The network congestion at a networking device may for example occur if a component or resource, such as a central processing unit (CPU) or a memory, of the networking device that contributes to transfer data of the networking device may not be able to process a high amount of data resulting in data waiting for transfer. In addition, as many hosts are accessing the network to perform READ/WRITE input/output (I/O) operations, this injects delay in data communication, and the congestion in the fabric of the network may become more hazardous. This is a common problem when multiple hosts are accessing heavy data at the same time-duration in a day. Because of the network congestion, the applications are started experiencing higher latency and may experience I/O failures and sometimes application crashes. For example, the congestion to one switch in a large fabric can cause performance issues throughout the entire fabric, including traffic between hosts and their associated storage resources, even if they are not directly attached to the congested switch. Embodiments of the present invention may control the congestion to prevent the above-mentioned drawbacks. This may allow an increase of network utilization while maintaining quality of service.

For example, a switch controller (or a controller or a computer system) may be provided. The switch controller may be configured to monitor (or collect information on) the data traffic at the networking devices. The switch controller may be configured to monitor (or collect information on) available resources in the storage system. This may enable the switch controller to have access to information that enables the switch controller to perform at least part of the present method. The monitoring or collection of information may, for example, be performed using communication protocols that that are supported by the storage system such as Ethernet protocol or Small Computer System Interface (SCSI) protocol.

In another example, the switch controller may be configured to provide the information about data traffic at the networking devices to a computer system, wherein the computer system may, for example, be a host or a node of the storage system. The computer system may be configured to monitor (or collect information on) available resources in the storage system. The computer system may use the collected information and the received information from the switch controller to perform at least part of the present method.

The network congestion at a networking device (or involving the networking device) refers to a state of the network that causes network transmission performance to decline. That state may, for example, be defined by an amount of data that is waiting to be transferred by the networking device that is higher than a threshold and/or defined by an amount of data to be transferred that is higher than the amount of data that can be handled by the networking device. The evaluation of the state may, for example, be performed using monitoring information about the data traffic in the storage system.

According to one embodiment, the determination of the occurrence of the congestion comprises detecting the network congestion using in-bound and/or out-of-bound application programming interfaces (APIs) to the networking device, in which the APIs may be configured to collect information on data traffic through the networking device allowing the congestion to be determined using the collected information.

This embodiment may optimize the various levels of operations in a unified appliance used for a big data and analytics system by managing the operation across the appliance level. In particular, this embodiment may control internal operations of storage subsystems and effectively tune them based on the system's requirement.

According to one embodiment, the determination of the occurrence of the congestion is performed upon receiving a congestion signal of a data link control protocol, in which the congestion signal comprises at least one of a receive not ready (RNR) signal or Ethernet Flow control signal. This embodiment may seamlessly be integrated in existing systems. For example, the switch controller is configured to intercept or receive signals from the data link control protocol. The switch controller may be configured to detect the network congestion.

The data link refers to a connection between a node and a storage device. The data link may be fully wired, fully wireless, or some aggregation of wired and wireless data communications pathways. Information may be exchanged between the storage device and the node via the data link using one or more data communications protocols. The information may be exchanged in unencrypted format in accordance with the normal data access mode of operation.

According to one embodiment, the determining of the network congestion comprises predicting the occurrence of the network congestion in a future time period, wherein the switching is performed during the time period or during another time period preceding the time period. This may enable a time-bounding of the in-flight data compression. The time-bounding of the in-flight data compression may enable features in storage-as-a-service models where the user can configure the in-flight data compression to avoid or resolve the network congestion.

According to one embodiment, the switching comprises performing a handshake between the storage device and the node of the identified data link for triggering a compression protocol execution at the node and the storage device of the identified link, wherein the compression protocol execution at each of the node and the storage device comprises decompressing received compressed data and compressing data to be submitted. This may enable a systematic and controllable communication of data in the compressed format. For example, if more than one data link is identified in the identifying step, the switching may be performed for each identified data link of the identified data links. The handshaking may be performed between the storage device and the node of each data link of the identified data links.

According to one embodiment, the method further comprises sending a protocol command signal to the storage device of the identified data link and performing the handshaking by the storage device upon receiving the protocol command signal. For example, the data link control protocol may be configured so that it provides and sends the protocol command signal upon determining the network congestion.

According to one embodiment, the identification of the data link is performed using an in-bound or out-of-bound API between the storage device and the node. This may enable a simplified implementation, which may seamlessly be integrated in existing systems.

According to one embodiment, the switching to the compressed data access mode is selectively performed for a predefined type of data to be communicated between the node and the storage device of the identified data link. The type of data may, for example, be defined by a property of the data and/or by the source where the data comes from. The property of the data may, for example, be the data format and/or the age of the data. This may enable a selective in-flight data compression for a set of objects or inherited object lists. The object list may comprise a volume, or host of storage devices, or data types based on user configuration settings. For example, if the volume is comprised in the list, the data of that volume may be processed in accordance with the compressed data access mode. This embodiment may solve the network congestion with minimal changes to data communication in the network of storage devices, e.g., only part of the communicated data is compressed.

According to one embodiment, the predefined type of data is user defined. For example, a user setting may be provided.

The user setting enables the user to define which kind of data to be compressed in the compressed data access mode.

According to one embodiment, the at least one data link comprises multiple data links. For each data link of the multiple data links, the switching to the compressed data access mode may be selectively performed for a respective distinct type of data to be communicated between the node and the storage device of the data link. The compression may be dependent on the links. This may further increase the flexibility of the present invention. The user may be able to define which data to be compressed and on which link.

According to one embodiment, the identifying comprises identifying a plurality of data links involving respective pairs of node and storage device, each of which having the defined amount of available processing resources, and selecting from the plurality of the data links the at least one data link based on a user defined selection criterion.

According to one embodiment, the user defined selection criterion excludes predefined storage devices and/or nodes.

According to one embodiment, the defined amount of available processing resources comprising at least one of an amount of CPU, an amount of system memory, a number of hardware-based compression accelerators, software or hardware-based compression algorithm features being selected from a name, and a compression technique of the compression algorithm. This embodiment may make use of existing resources of the network without having to request additional resources.

The network of storage devices usually comprises powerful hardware (e.g., CPU and other processing units) to support many servers and computers that often run underutilized. However, in the presence of network congestion, even if a server computer is free, it may not be used to serve the I/Os in a faster way as every I/O may stuck in the congested network (e.g. storage CPUs may be free, but they cannot be utilized as the network is congested and adding more amplified packets would cause more delay in data transmission). This creates a logical imbalance in the storage system, in which CPUs are free but cannot be utilized because of the network congestion. The present invention may take actions to reduce this congestion in the appliance to achieve acceptable I/O latencies for the applications. This may prevent having switches stopping to accept additional frames until the congestion clears and to occasionally drop frames.

According to one embodiment, the method further comprises switching back the data access mode for the identified data link from the compressed data access mode to the normal data access mode in response to determining at least one of the node or the storage device of the identified data link does not have the defined amount of available processing resources, the network congestion is resolved, and/or receiving a user switching request.

According to one embodiment, the network is a storage area network (SAN).

According to one embodiment, the node of the network is configured to perform the data access to the storage device on behalf of one or more hosts of the network.

According to one embodiment, the identified link is a congested link. This may enable an efficient and direct solving of the congestion by changing the data communication of the congested link itself.

FIG. 1 is a block diagram of a storage system 100 in accordance with an embodiment of the present invention. Storage system 100 may include storage devices 103. The storage devices 103, although physically distinct from one another, may be logically grouped into one or more volumes of storage devices. The storage devices 103 may comprise arrays of hard-disk drives or solid-state drives, tape libraries, individual hard-disk drives or solid-state drives, tape drives, CD-ROM libraries, or the like. The storage devices may, for example, form redundant array of independent disks (RAID) storage systems.

The storage devices 103 may be accessed by one or more nodes 102. Data access to the storage devices 103 may comprise reading data from a storage device, writing data into a storage device, or processing data in a storage device (i.e., moving or replacing data). The nodes 102 may be connected to storage devices 103 via a network 104. The network 104 may include one or more local area network (LAN) and/or wide area network (WAN) and/or storage area network (SAN). To access a storage device 103, a node 102 may communicate over a physical connection or data link 105 from one or more ports on the node to one or more ports on the storage device 103. A data link (i.e., connection) may be through a networking device 106 such as a switch or fabric, or the like. In one example, the nodes 102 and storage devices 103 may communicate using a networking standard such as Fibre Channel (FC) or Internet SCSI (iSCSI). For example, the SCSI command descriptor block (CDB) mechanism may be used to implement inbound or out-of-bound APIs for communication across components of the storage system 100 wherein CDB may be used to exchange the commands across the components, which are usually comprised of 6, 10, 12, or 16 bytes based on SCSI standards.

The storage system 100 may comprise one or more networking devices 106, i.e., switches. The networking device may mediate data transmission the network, e.g., between the storage devices and the nodes. The networking devices may or may not be connected to each other. For example, a networking device may operate as a stand-alone with no connections to other networking devices. In another example, two networking devices may be cascaded, or connected to each other with inter-switch links. For example, each networking device may be connected to at least one other networking device in the fabric. The area of the network 104 that contains the networking devices 106 may be named a fabric of the network, e.g., SAN fabric. The networking devices 106 that are explicitly shown are for exemplary purposes only, as more or less networking devices may be present in the fabric.

Each networking device of the networking devices 106 may be configured to share available resources of the networking device 106 between data links 105 that pass through of the networking device 106. For example, a network congestion may be linked to the processing issues within CPUs on a networking device, which are shared between data links passing through that networking device. For example, the network may experience congestion because of heavy application I/O in the fabric. The network congestion may cause slow response times or a storage access loss.

Each node of the nodes 102 may perform a data access to the storage devices 103 using a data access mode that is a normal data access mode (or default data access mode). The normal data access mode enables nodes to communicate data in uncompressed format.

A switch controller may be connected to each networking device in the fabric, either directly or via one or more additional connections and/or devices. The switch controller may be configured to monitor inbound and outbound traffic of each of the networking devices. The switch controller may comprise APIs to the networking devices that enable to monitor the inbound and outbound traffic.

Figure 2:
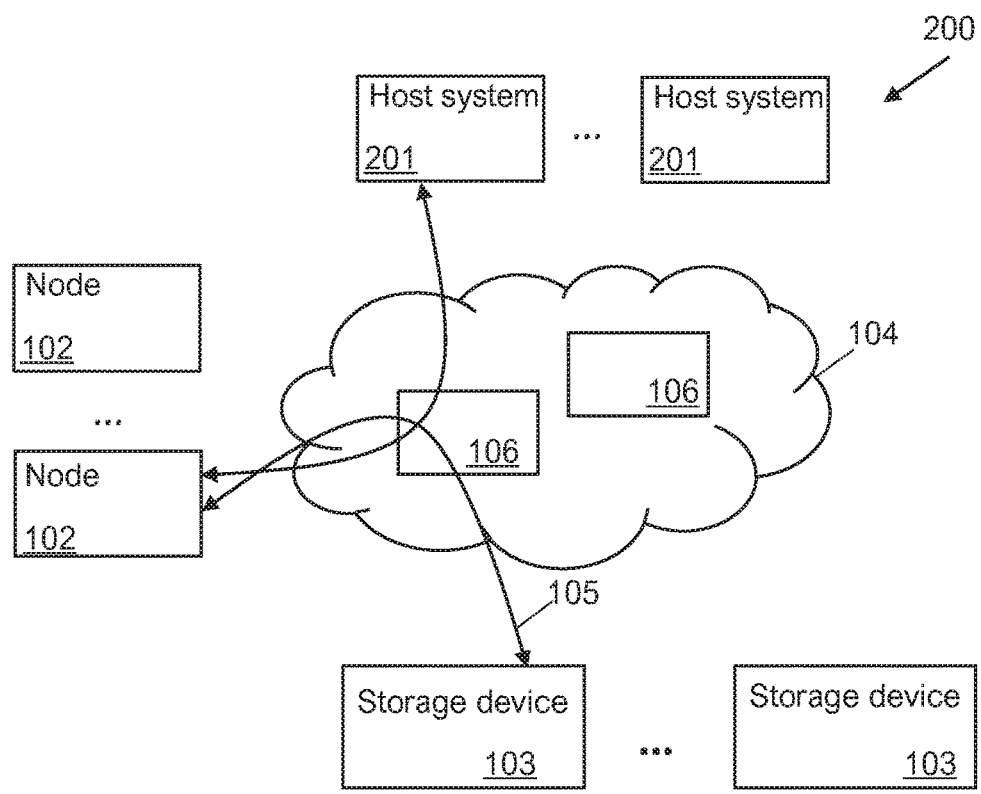
FIG. 2 is a block diagram of a storage system in accordance with an embodiment of the present invention.

FIG. 2 is a block diagram of a storage system 200 in accordance with an embodiment of the present invention.

The storage system 200 comprises the storage system 100 of FIG. 1 and one or more host systems 201. The host system 201 may be a computing device through which one or more users may access the storage devices 103. The computing devices may include any of a wide variety of computing systems, such as stand-alone personal desktop or laptop computers (PC), workstations, personal digital assistants (PDAs), mobile devices, server computers, or appliances, etc. Each of the computing devices may include memory, storage, and a degree of data processing capability at least sufficient to manage a connection to the storage system 100 via network 104.

The nodes 102 may present volumes to the hosts 201. The volumes may for example be created from managed disks (MDisks) that are presented by a RAID storage system. The volumes may also be created by arrays that are provided by flash drives in an expansion enclosure. All data transfer from a host to a storage device of a given volume occurs through the node, which is described as symmetric virtualization. The data communication over data link 105 may be triggered or initiated by corresponding requests received from one or more host at the node as indicated by an arrow between the host and the node. For example, a host 201 may send a read request to the node. The node may send over data link 105 a corresponding data read request to the storage device where the data to be read is stored.

Figure 3:
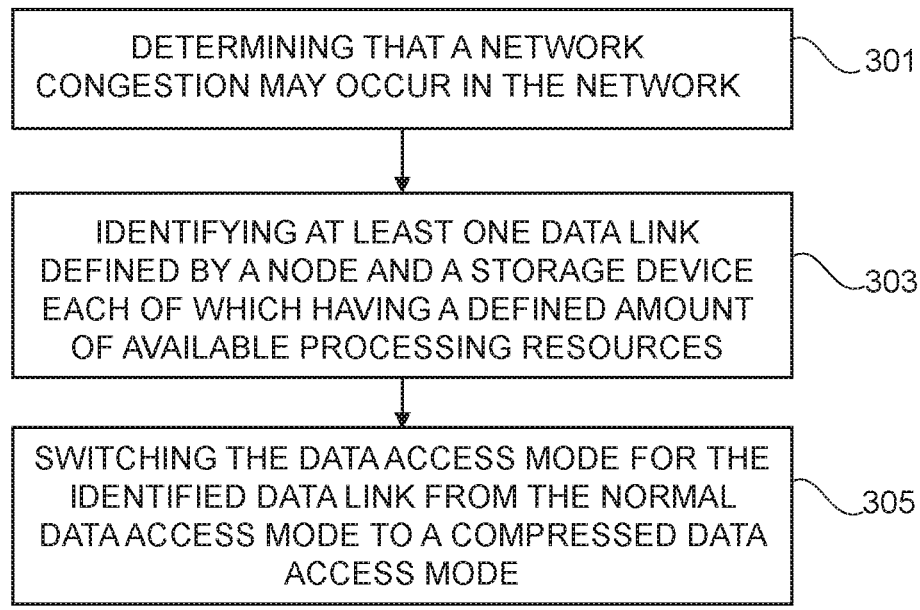
FIG. 3 is a flowchart of a method for data communication between nodes and storage devices via a networking device of a network in accordance with an embodiment of the present invention.

FIG. 3 is a flowchart of a method for data communication between nodes and storage devices via a networking device of a network. The method may be implemented in the system of FIG. 1 or FIG. 2, but it is not limited to that implementation.

It may be determined in step 301 that a network congestion may occur in the network 104. The network congestion may, for example, be indicated by a reduced quality of service that occurs when a network node or data link is carrying more data than it can handle. Typical effects of the network congestion include a queueing delay, a packet loss, or the blocking of new connections.

For example, the network congestion may be detected using monitoring information of the data traffic to the networking device. This monitoring information may be obtained by a switch controller. The occurrence of the network congestion may, for example, be detected by pro-actively monitoring I/O performance and behavior at the fabric of the networking devices. The detection of the network congestion may be performed using a built-in instrumentation (e.g. the switch controller) comprising APIs to the networking devices 106. This may provide insight into potential problems and ensure service levels by gathering I/O statistics. Obtaining multiple I/O statistics, including the maximum and average times for first responses, latency and outstanding I/Os for specific host or storage devices may enable detection of the network congestion. For example, in-bound and/or out-of-bound APIs to the networking devices may be used to collect information on data traffic through the network devices. The determination of the occurrence of the network congestion may be performed using the collected information.

In another example, the network congestion may be predicted. For example, using historical data of the storage system 100, it may be determined when a network congestion may occur based on previous experiences. This may enable a dynamic in-flight data compression mechanism based on time events. For example, an event may require compression of a remote copy replication for volume A to volume A' via a one or more nodes from 9 AM to 11 AM.

In response to predicting or detecting the network congestion, at least one data link may be identified in step 303. The identified data link may comprise end points. The end points may be a node and a storage device. The identified data link passes through the networking device that has the network congestion. The node and the storage device of the identified data link may each have a respective defined amount of available processing resources. The identifying step 303 may be performed using resource information of available resources in the storage system. The resource information may, for example, be obtained or collected by the switch controller or another component of the storage system. The available processing resources may be used for performing compression of data to be communicated and decompression of received compressed data. For example, the identification of a data link may require available CPU on both ends but it doesn't need to be symmetrical. Depending on the compression method used, it might require more CPU power for compressing than for decompressing.

Figure 4:
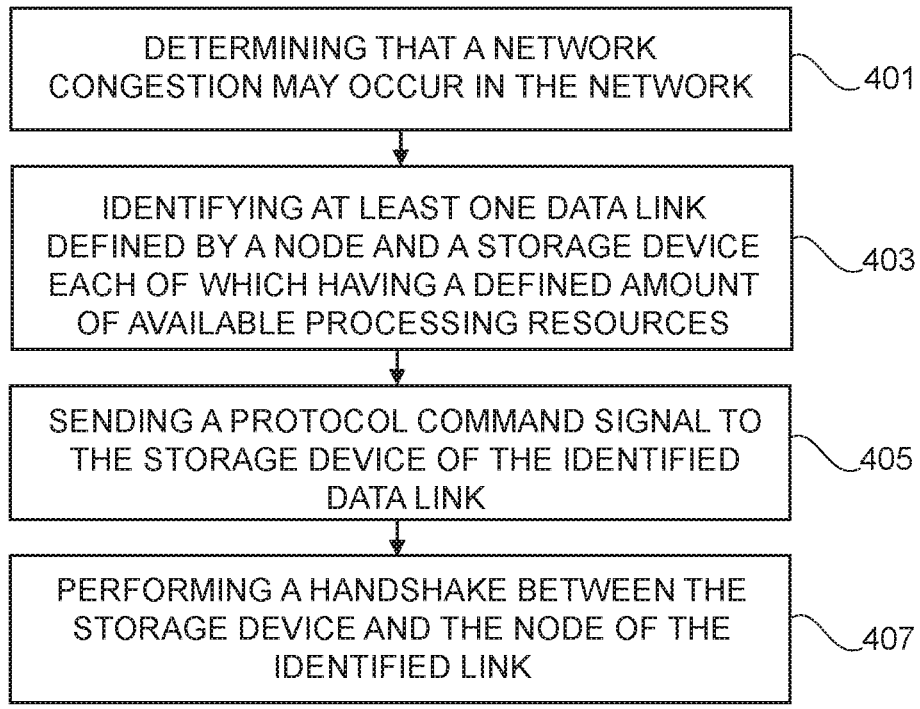
FIG. 4 is a flowchart of a method for data communication between nodes and storage devices via a networking device of a network in accordance with an embodiment of the present invention.

The data access mode for the identified data link may be switched in step 305 from the normal data access mode to a compressed data access mode. This may be performed by sending a command to the storage device and the node of the identified data link so that they can switch to the compressed data access mode (another example for switching to the compressed data access mode is shown in FIG. 4). The compressed data access mode enables exchange of compressed data via the identified data link. By exchanging the compressed data, available resources of the congested networking device may increase which may resolve the network congestion as additional available resources may be shared with congested links.

FIG. 4 is a flowchart of a method for data communication between nodes and storage devices via a networking device of a network. The method may be implemented in the system of FIG. 1 or FIG. 2, but it is not limited to that implementation.

It may be determined in step 401 that a network congestion may occur in the network 104. In response to predicting or detecting the network congestion, a data link may be identified in step 403. A protocol command signal may be sent in step 405 to the storage device of the identified data link. In response to receiving the protocol command signal, a handshake between the storage device and the node of the identified link may be performed in step 407. This may trigger a compression protocol execution at the node and the storage device of the identified link, wherein the compression protocol execution at each of the node and the storage device comprises decompressing received compressed data and compressing data to be submitted.

Figure 5:
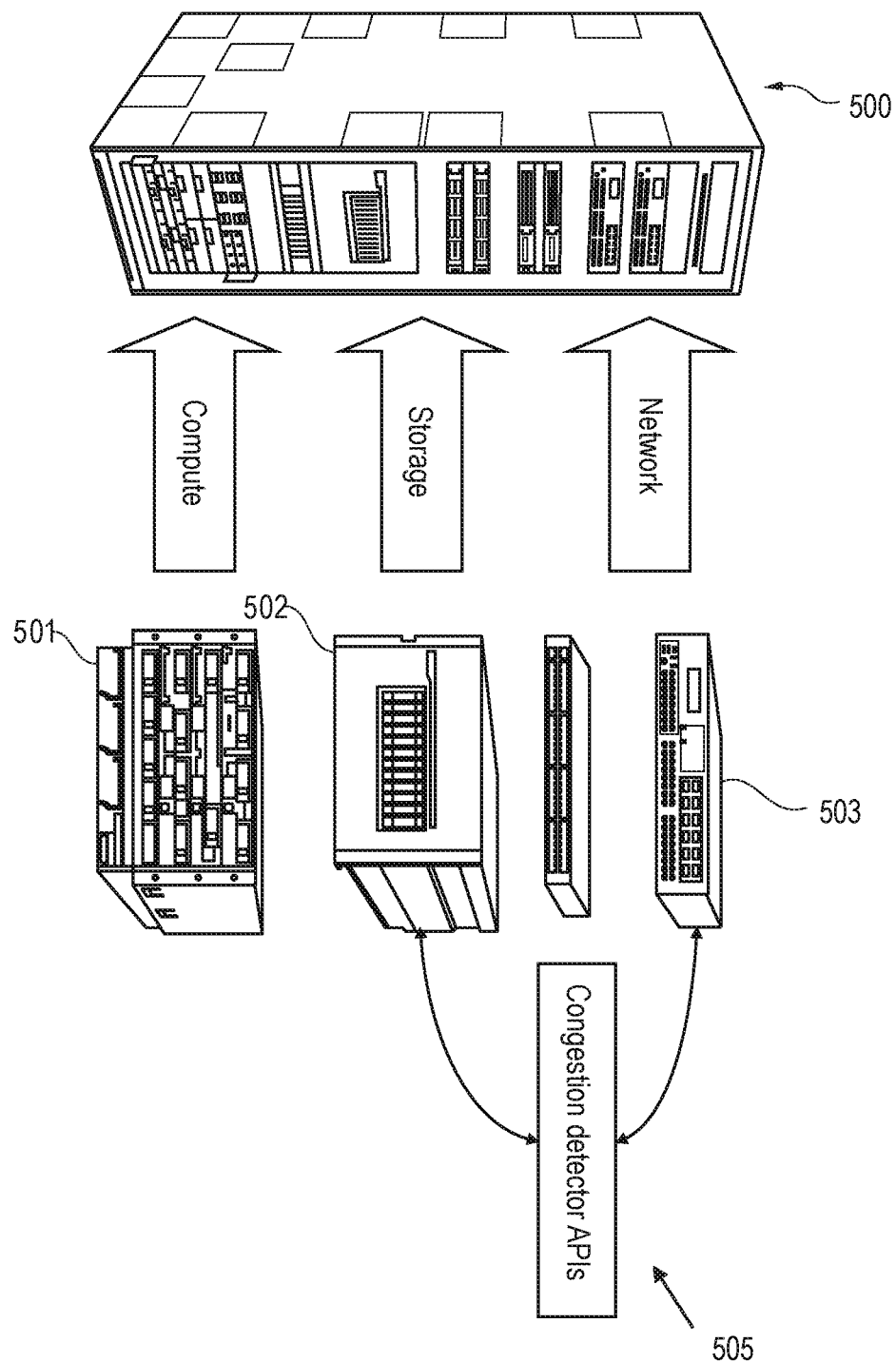
FIG. 5 is a block diagram of a storage system in accordance with an embodiment of the present invention.

FIG. 5 is a block diagram of a storage system 500 in accordance with an embodiment of the present invention. The storage system 500 comprises a computing node 501, a storage device 502, and network switch 503. The storage system 500 further comprises a switch controller 505 that has a congestion detection API. The congestion detector API enables the switch controller 505 to monitor data traffic to the switch, e.g., data traffic between the network switch 503 and the storage device 502. The switch controller 505 may further be configured to monitor or collect information on available resources in the storage system 500. This may enable the switch controller 505 to perform at least part of the present method.

Figure 6:
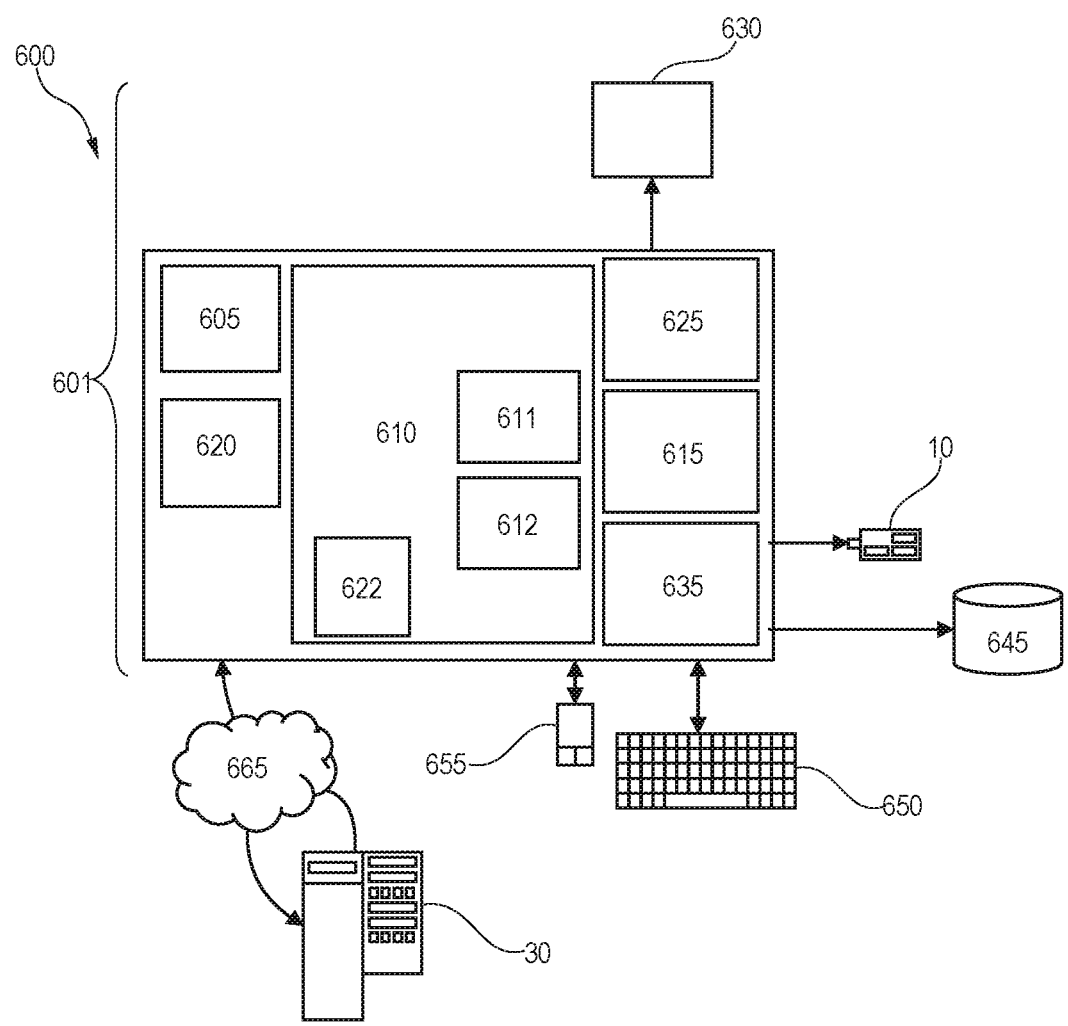
FIG. 6 represents a computerized system, suited for implementing one or more method steps as involved in an embodiment of the present invention.

FIG. 6 represents a general computerized system 600 (e.g., the switch controller) suited for implementing at least part of method steps as involved in the disclosure.

It will be appreciated that the methods described herein are at least partly non-interactive, and automated by way of computerized systems, such as servers or embedded systems. In exemplary embodiments though, the methods described herein can be implemented in a (partly) interactive system. These methods can further be implemented in software 612, 622 (including firmware 622), hardware (processor) 605, or a combination thereof. In exemplary embodiments, the methods described herein are implemented in software, as an executable program, and is executed by a special or general-purpose digital computer, such as a personal computer, workstation, minicomputer, or mainframe computer. The most general system 600 therefore includes a general-purpose computer 601.

In exemplary embodiments, in terms of hardware architecture, as shown in FIG. 6, the computer 601 includes a processor 605, memory (main memory) 610 coupled to a memory controller 615, and one or more I/O devices (or peripherals) 10, 645 that are communicatively coupled via a local I/O controller 635. The I/O controller 635 can be, but is not limited to, one or more buses or other wired or wireless connections, as is known in the art. The I/O controller 635 may have additional elements, which are omitted for simplicity, such as controllers, buffers (caches), drivers, repeaters, and receivers, to enable communications. Further, the local interface may include address, control, and/or data connections to enable appropriate communications among the aforementioned components. As described herein the I/O devices 10, 645 may generally include any generalized cryptographic card or smart card known in the art.

The processor 605 is a hardware device for executing software, particularly that stored in memory 610. The processor 605 can be any custom made or commercially available processor, a CPU, an auxiliary processor among several processors associated with the computer 601, a semiconductor based microprocessor (in the form of a microchip or chip set), a macroprocessor, or generally any device for executing software instructions.

The memory 610 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM). Note that the memory 610 can have a distributed architecture, where various components are situated remote from one another, but can be accessed by the processor 605.

The software in memory 610 may include one or more separate programs, each of which comprises an ordered listing of executable instructions for implementing logical functions, notably functions involved in embodiments of this invention. In the example of FIG. 6, software in the memory 610 includes instructions 612, e.g., instructions to manage databases such as a database management system.

The software in memory 610 shall also typically include a suitable operating system (OS) 411. The OS 611 essentially controls the execution of other computer programs, such as possibly software 612 for implementing methods as described herein.

The methods described herein may be in the form of a source program 612, executable program 612 (object code), script, or any other entity comprising a set of instructions 612 to be performed. When a source program, then the program needs to be translated via a compiler, assembler, interpreter, or the like, which may or may not be included within the memory 610, to operate properly in connection with the OS 611. Furthermore, the methods can be written as an object-oriented programming language, which has classes of data and methods, or a procedure programming language, which has routines, subroutines, and/or functions.

In exemplary embodiments, a conventional keyboard 650 and mouse 655 can be coupled to the input/output controller 635. Other output devices such as the I/O devices 645 may include input devices, for example but not limited to a printer, a scanner, microphone, and the like. Finally, the I/O devices 10, 645 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The I/O devices 10, 645 can be any generalized cryptographic card or smart card known in the art. The system 600 can further include a display controller 625 coupled to a display 630. In exemplary embodiments, the system 600 can further include a network interface for coupling to a network 665. The network 665 can be an IP-based network for communication between the computer 601 and any external server, client and the like via a broadband connection. The network 665 transmits and receives data between the computer 601 and external systems 30, which can be involved to perform part, or the steps of the methods discussed herein. In exemplary embodiments, network 665 can be a managed IP network administered by a service provider. The network 665 may be implemented in a wireless fashion, e.g., using wireless protocols and technologies. The network 665 can also be a packet-switched network such as a local area network, wide area network, metropolitan area network, Internet network, or other similar type of network environment. The network 665 may be a fixed wireless network, a wireless local area network (LAN), a wireless wide area network (WAN) a personal area network (PAN), a virtual private network (VPN), intranet, or other suitable network system and includes equipment for receiving and transmitting signals.

If the computer 601 is a PC, workstation, intelligent device or the like, the software in the memory 610 may further include a basic input output system (BIOS) 622. The BIOS is a set of essential software routines that initialize and test hardware at start-up, start the OS 611, and support the transfer of data among the hardware devices. The BIOS is stored in ROM so that the BIOS can be executed when the computer 601 is activated.

When the computer 601 is in operation, the processor 605 is configured to execute software 612 stored within the memory 610, to communicate data to and from the memory 610, and to generally control operations of the computer 601 pursuant to the software. The methods described herein and the OS 611, in whole or in part, but typically the latter, are read by the processor 605, possibly buffered within the processor 605, and then executed.

When the systems and methods described herein are implemented in software 612, as is shown in FIG. 6, the methods can be stored on any computer readable medium, such as storage 620, for use by or in connection with any computer related system or method. The storage 620 may comprise a disk storage such as HDD storage.

Programs described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:

determining, by one or more processors, that a network congestion occurs in a network, wherein determining the network congestion occurs in the network comprises responsive to receiving a congestion signal of a data link control protocol, determining, by the one or more processors, the network congestion occurs in the network, wherein the congestion signal includes at least one of a receive not ready (RNR) signal or an Ethernet Flow control signal, wherein the network enables data communication between a plurality of nodes and a plurality of storage devices via a networking device of the network, and wherein the network congestion involves the networking device;

identifying, by the one or more processors, at least one data link defined by a node and a storage device each of which having a defined amount of available processing resources; and switching, by the one or more processors, a data access mode for the at least one data link from a normal data access mode to a compressed data access mode, wherein the compressed data access mode enables exchange of compressed data via the at least one data link, wherein the switching is selectively performed for a predefined type of data to be communicated between the node and the storage device of the at least one data link, and wherein the predefined type of data is at least one of a data format and an age of the data.

2. The method of claim 1, wherein determining the network congestion occurs in the network further comprises:

detecting, by the one or more processors, the network congestion using at least one of in-bound and out-of-bound application programming interfaces (APIs) to the networking device, the APIs being configured to collect information on data traffic through the networking device, wherein the network congestion is determined using the collected information.

3. The method of claim 1, wherein determining the network congestion occurs in the network comprises:

predicting, by the one or more processors, the occurrence of the network congestion in a future time period.

4. The method of claim 1, wherein switching the data access mode for the at least one data link from the normal data access mode to the compressed data access mode further comprises:

performing, by the one or more processors, a handshake between the storage device and the node of the at least one data link for triggering a compression protocol execution at the node and the storage device of the at least one data link, wherein the compression protocol execution at the node and the storage device comprises decompressing received compressed data and compressing data to be submitted.

5. The method of claim 4, wherein switching the data access mode for the at least one data link from the normal data access mode to the compressed data access mode further comprises:

sending, by the one or more processors, a protocol command signal to the storage device of the at least one data link and performing the handshaking by the storage device upon receiving the protocol command signal.

6. The method of claim 1, wherein identifying the at least one data link defined by the node and the storage device is performed using an in-bound or out-of-bound API between the storage device and the node.

7. The method of claim 1, wherein the predefined type of data is user defined.

8. The method of claim 1, wherein switching the data access mode for the at least one data link from the normal data access mode to a compressed data access mode is selectively performed for a respective distinct type of data to be communicated between the node and the storage device of the data link.

9. The method of claim 1, wherein identifying the at least one data link defined by the node and the storage device comprises:

identifying, by the one or more processors, a plurality of data links involving respective pairs of node and storage device each of which having the defined amount of available processing resources; and selecting, by the one or more processors, from the plurality of the data links the at least one data link based on a user defined selection criterion.

10. The method of claim 9, wherein the user defined selection criterion excludes predefined storage devices and nodes.

11. The method of claim 1, wherein the defined amount of available processing resources comprises at least one of: an amount of CPU, an amount of system memory, a number of hardware-based compression accelerators, software or hardware-based compression algorithm features being selected from a name; and a compression technique of the compression algorithm.

12. The method of claim 1, further comprising:

switching back, by the one or more processors, the data access mode for the identified data link from the compressed data access mode to the normal data access mode in response to determining at least one of: (1) the node or the storage device of the identified data link does not have the defined amount of available processing resources, (2) the network congestion is resolved, and (3) a user switching request is received.

13. The method of claim 1, wherein the network is a storage area network (SAN).

14. The method of claim 13, wherein the node of the network is configured to perform the data access to the storage device on behalf of one or more hosts of the network.

15. The method of claim 1, wherein the at least one data link is a congested link.

16. The method of claim 1, wherein the switching being selectively performed for the predefined type of data enables a selective in-flight data compression for a set of objects.

17. A computer program product comprising:

one or more computer readable storage media and program instructions stored on the one or more computer readable storage media, the program instructions comprising:

program instructions to determine that a network congestion occurs in a network, wherein determining the network congestion occurs in the network comprises responsive to receiving, a congestion signal of a data link control protocol, program instructions to determine the network congestion occurs in the network, wherein the congestion signal includes at least one of a receive not ready (RNR) signal or an Ethernet Flow control signal, wherein the network enables data communication between nodes and storage devices via a networking device of the network, and wherein the network congestion involves the networking device;

program instructions to identify at least one data link defined by a node and a storage device each of which having a defined amount of available processing resources; and program instructions to switch a data access mode for the at least one data link from a normal data access mode to a compressed data access mode, wherein the compressed data access mode enables exchange of compressed data via the at least one data link, wherein the switching is selectively performed for a predefined type of data to be communicated between the node and the storage device of the at least one data link, and wherein the predefined type of data is at least one of a data format and an age of the data.

18. A computer system comprising:

one or more computer processors;

one or more computer readable storage media;

program instructions stored on the computer readable storage media for execution by at least one of the one or more processors, the program instructions comprising:

program instructions to determine that a network congestion occurs in a network, wherein determining the network congestion occurs in the network comprises responsive to receiving a congestion signal of a data link control protocol, program instructions to determine the network congestion occurs in the network, wherein the congestion signal includes at least one of a receive not ready (RNR) signal or an Ethernet Flow control signal, wherein the network enables data communication between nodes and storage devices via a networking device of the network, and wherein the network congestion involves the networking device;

program instructions to identify at least one data link defined by a node and a storage device each of which having a defined amount of available processing resources; and program instructions to switch a data access mode for the at least one data link from a normal data access mode to a compressed data access mode, wherein the compressed data access mode enables exchange of compressed data via the at least one data link, wherein the switching is selectively performed for a predefined type of data to be communicated between the node and the storage device of the at least one data link, and wherein the predefined type of data is at least one of a data format and an age of the data.

\* \* \* \* \*